United States Patent [19]
Li

[11] Patent Number: 5,982,621
[45] Date of Patent: Nov. 9, 1999

[54] ELECTRONIC DEVICE COOLING ARRANGEMENT

[75] Inventor: ji-Ming Li, Hsinchu, Taiwan

[73] Assignee: Caesar Technology Inc., Hsinchu, Taiwan

[21] Appl. No.: 09/197,436

[22] Filed: Nov. 23, 1998

[51] Int. Cl.[6] .................................................. H05K 7/20
[52] U.S. Cl. .......................... 361/704; 361/709; 361/710; 361/715; 361/719; 257/706; 257/712; 257/724; 257/732; 174/16.2; 165/80.2
[58] Field of Search ..................................... 361/704, 709, 361/710, 711, 712, 715, 718, 825; 257/704, 705–707, 712, 713, 720, 724, 729, 732, 730; 165/80.2, 80.3, 185; 174/16.3, 52.1, 52.2

[56] References Cited

U.S. PATENT DOCUMENTS 5,365,107  11/1994  Kuraishi et al. ..................... 257/673

*Primary Examiner*—Leo P. Picard
*Assistant Examiner*—Michael Datskovsky
*Attorney, Agent, or Firm*—Rosenberg, Klein & Bilker

[57] ABSTRACT

An electronic device cooling arrangement includes a heat sink bonded to a substrate above a chip on the substrate, the heat sink having a mounting section bonded to the substrate, a face panel section suspended above the chip and defining a tapered center through hole, and a supporting frame section connected between the face panel section and the mounting section, and a tapered heat conductive block mounted in the tapered center through hole and bonded to the chip for quick dissipation of heat from the chip.

20 Claims, 5 Drawing Sheets

ELECTRONIC DEVICE COOLING ARRANGEMENT

BACKGROUND OF THE INVENTION

The present invention relates to an electronic device cooling arrangement, and more specifically to the cooling arrangement of a BGA (ball grid array) package which can quickly carry heat from the CPU of the BGA package during the operation of the CPU.

In order to improve the function and data processing speed, the circuit structure of a CPU is complicated. When a CPU is operated, it produces much heat. During the operation of a CPU, heat must be quickly carried away. An accumulation of heat at a CPU cause the circuit of the CPU to be burned out soon. When a CPU is operated in a high temperature environment, its working efficiency and reliability will be greatly reduced. Therefore, it is quite important to reducing CPU working temperature.

SUMMARY OF THE INVENTION

The present invention has been accomplished under the circumstances in view. According to one aspect of the present invention, the electronic device cooling arrangement comprises a heat sink bonded to a substrate above a chip on the substrate, the heat sink having a mounting section bonded to the substrate, a face panel section suspended above the chip and defining a tapered center through hole, and a supporting frame section connected between the face panel section and the mounting section, and a tapered heat conductive block mounted in the tapered center through hole and bonded to the chip for quick dissipation of heat from the chip. According to another aspect of the present invention, the tapered heat conductive block is retained in the tapered center through hole at the face panel section at a lower elevation than the topmost edge of the face panel section, such that the application of a downward pressure to the heat sink against the substrate during bonding of the mounting section of the heat sink to the substrate does not cause the tapered heat conductive block to damage the chip.

DETAILED DESCRIPTION OF THE PREFERRED EMBODIMENT

Figure 1:
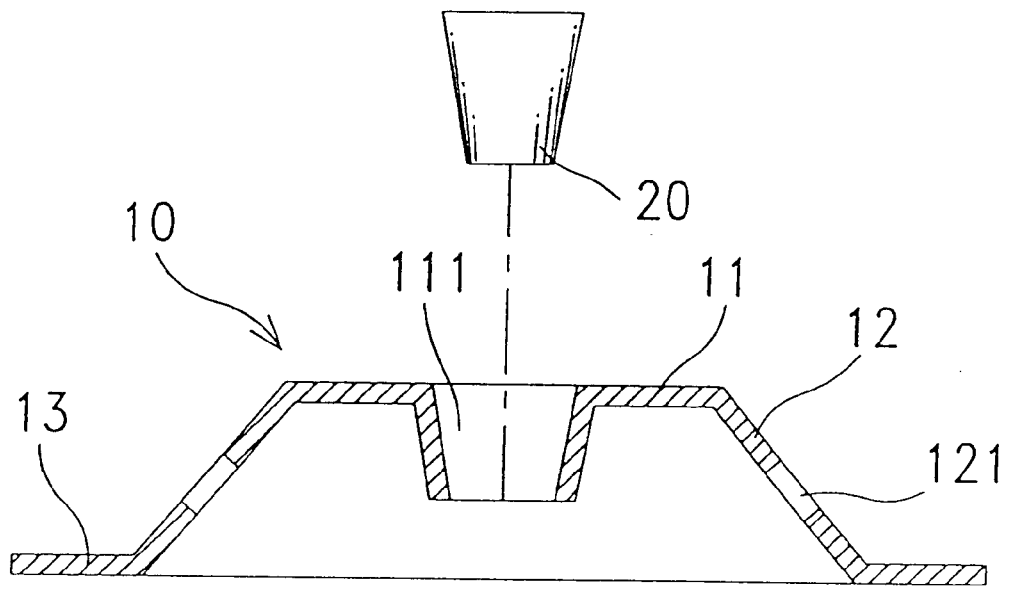
FIG. 1 is an exploded view in section of an electronic device cooling device according to the present invention.
Figure 2:
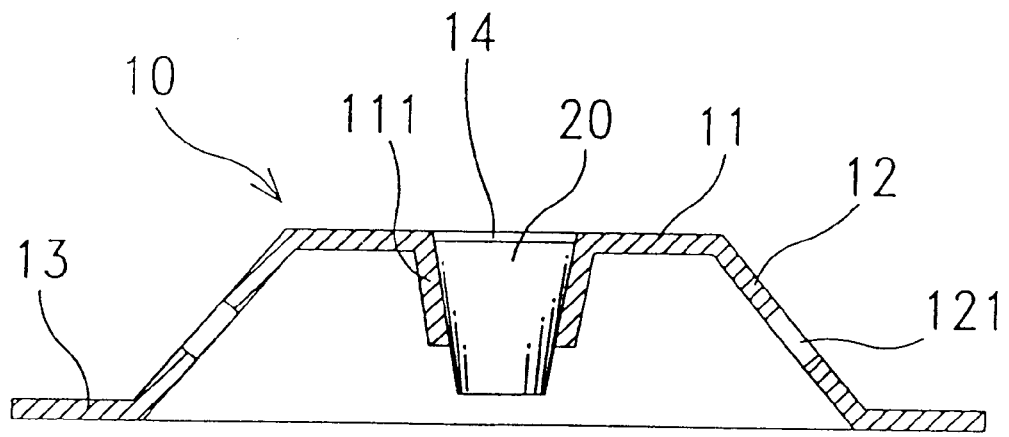
FIG. 2 is a sectional assembly view of the cooling device shown in FIG. 1.
Figure 3:
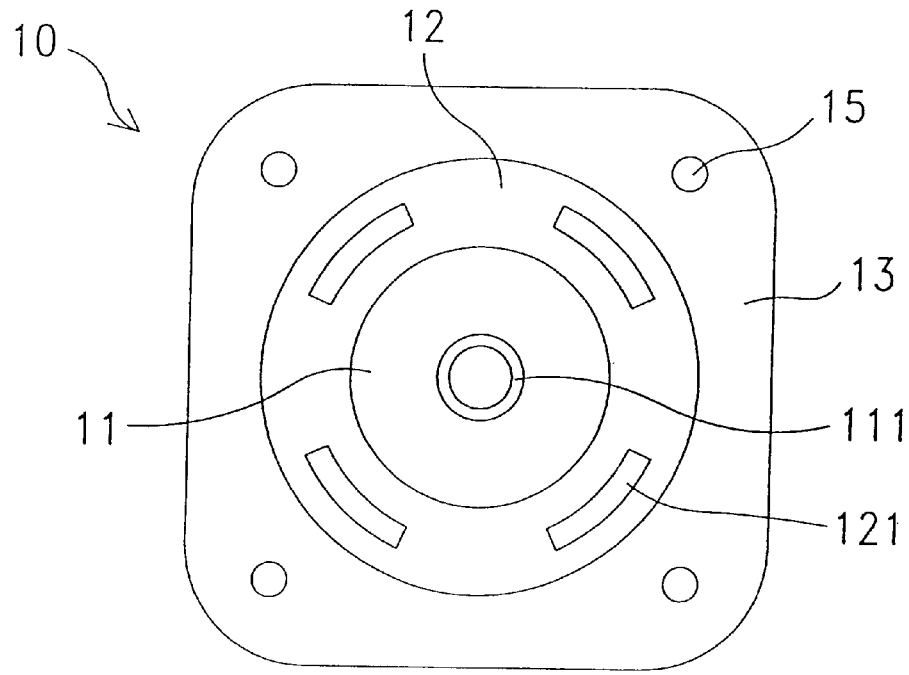
FIG. 3 is a top view of a heat sink for the electronic device cooling device shown in FIG. 1.

Referring to FIGS. from 1 through 3, a heat sink 10 is shown having a mounting section 13, a supporting frame section 12, and a face panel section 11. The supporting frame section 12 supports the face panel section 11 on the mounting section 13. The mounting section 13 and the face panel section 11 are disposed at different elevations, i.e., the face panel section 11 is suspended above the mounting section 13. The supporting frame section 12 has a plurality of slots 121. The face panel section 11 has a downwardly extended projecting portion at the center defining a tapered center through hole 11. The tapered center through hole 111 has a diameter gradually reducing from the top side (the face panel section 11) toward the bottom side (the mounting section 13). A tapered heat conductive block 20 is fastened to the tapered center through hole 111 at the center of the face panel section 11.

The aforesaid heat sink 10 and tapered heat conductive block 20 are respectively made of metal, for example, copper or aluminum.

Figure 4:
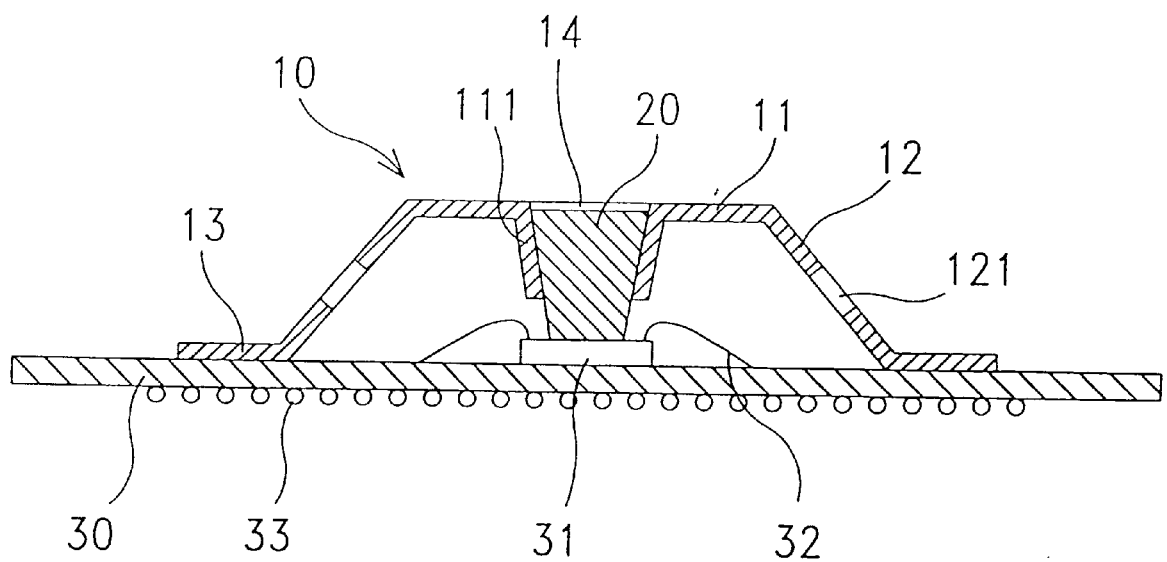
FIG. 4 is a sectional view showing the heat sink mounted on the substrate of a BGA package, the tapered heat conductive block disposed in contact with a CPU on the substrate.

Referring to FIG. 4, the aforesaid heat sink 10 is mounted on the substrate 30 of a BGA (ball grid array) package, and covered on a CPU 31 at the substrate 30 for quick dissipation of heat. The contact area between the mounting section 13 and the substrate 30 as well as the contact area between the tapered heat conductive block 20 and the CPU 31 are covered with a layer of glue, and then a pressure is applied to the heat sink 10 against the substrate 30 to seal the mounting section 13 to the substrate 30 and the tapered heat conductive block 20 to the CPU 31. After installation, there is no gap left between the mounting section 13 and the substrate 30. The glue used is an electrically conductive glue. Silver powder contained glue is an optimum choice for the electrically conductive glue.

In order to prevent a damage to the CPU 31 when bonding the heat sink 10 and the substrate, a gap 14 is left between the topmost edge of the face panel section 11 and the topmost edge of the tapered heat conductive block 20. When the heat sink 10 is pressed downwards against the substrate 30 during bonding, the downward pressure from the heat press is not directly applied to the heat conductive block 20.

The CPU 31 is electrically connected to the balls 33 of the BGA package at the bottom side of the substrate 30 by lead wires 32. Because the mounting section 13 of the heat sink 10 is bonded to the substrate 30 and the downwardly extended projecting portion of the tapered center through hole 111 of the face panel section 11 of the heat sink 10 is disposed close to the lead wires 32, little electric induction is produced at the heat sink 10. Further, the mounting section 13 of the heat sink 10 has a plurality of through holes 15 respectively connected to grounding contacts at the substrate 30 to reduce the production of an electric induction.

Figure 5:
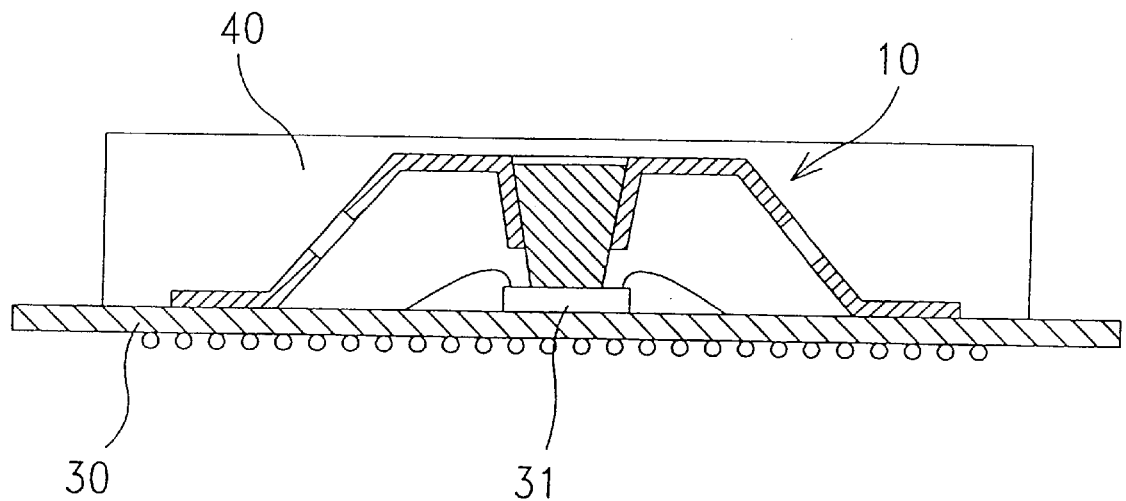
FIG. 5 is a sectional view of a BGA package, showing the packing material molded on the substrate, the electronic device cooling device embedded in the packing material according to the present invention.
Figure 6:
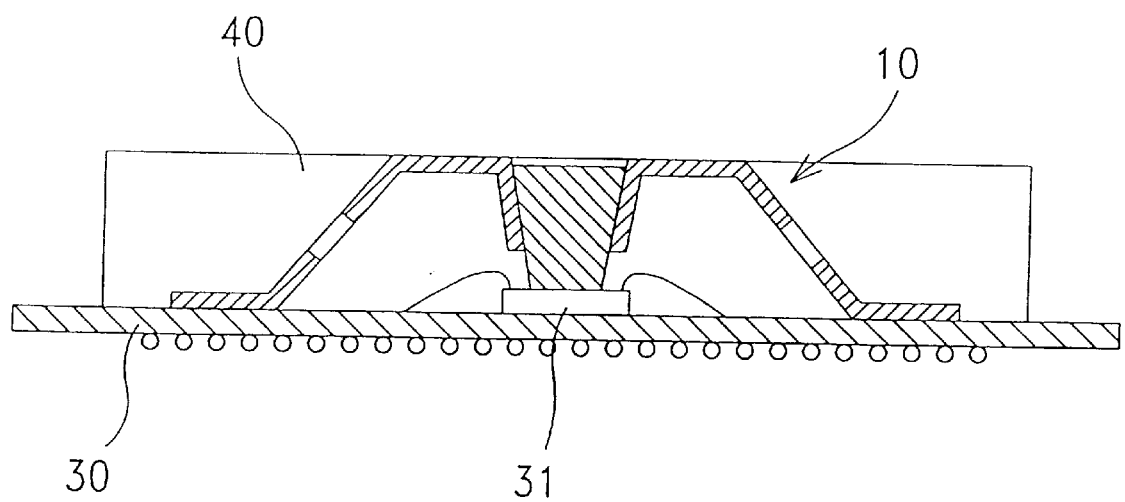
FIG. 6 is a sectional view of a BGA package, showing the packing material covered on a part of the heat sink according to the present invention.

Referring to FIGS. 5 and 6 show two application examples of the present invention, namely, the embedded type package and an exposed type package. In the embedded type package as shown in FIG. 5, the packing material 40 which is directly molded on the substrate 30 covers the whole area of the heat sink 10. In the exposed type package as shown in FIG. 6, the packing material 40 covers only a part of the heat sink 30, and the face panel section 11 of the heat sink 10 remains exposed to the outside. The packing material 40 is selected from electrically insulative and water proof material, for example, epoxy resin.

Figure 7:
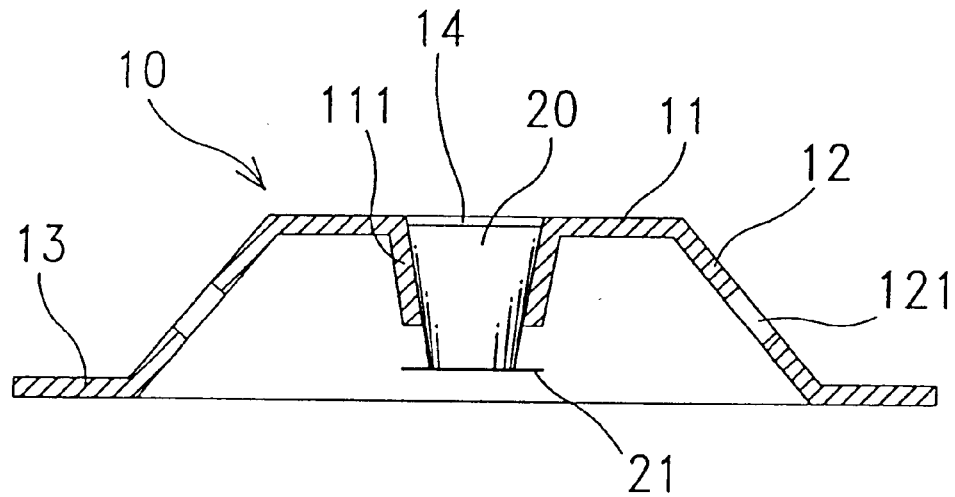
FIG. 7 is a sectional view of an alternate form of the present invention, showing an outward locating flange integral with the periphery of the bottom end of the tapered heat conductive block.

Referring to FIG. 7, after installation of the tapered heat conductive block 20 in the tapered center through hole 111 of the face panel section 11 of the heat sink 10, the bottom end of the tapered heat conductive block 20 is hammered down to form an outward locating flange 21. The outward locating flange 21 stops the tapered heat conductive block 20 from escaping out of the tapered center through hole 11 of the face panel section 11.

Figure 8:
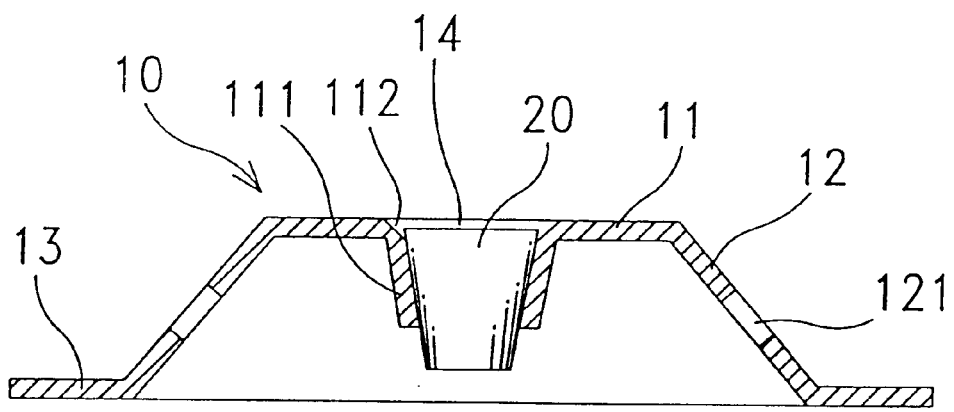
FIG. 8 is a sectional view of another alternate form of the present invention, showing a chamfered guide edge provided at the face panel section of the heat sink around the tapered center through hole.

Referring to FIG. 8, the face panel section 11 of the heat sink 10 has a chamfered guide edge 112 around the tapered center through hole 111 for guiding the tapered heat conductive block 20 into the tapered center through hole 111.

Figure 9:
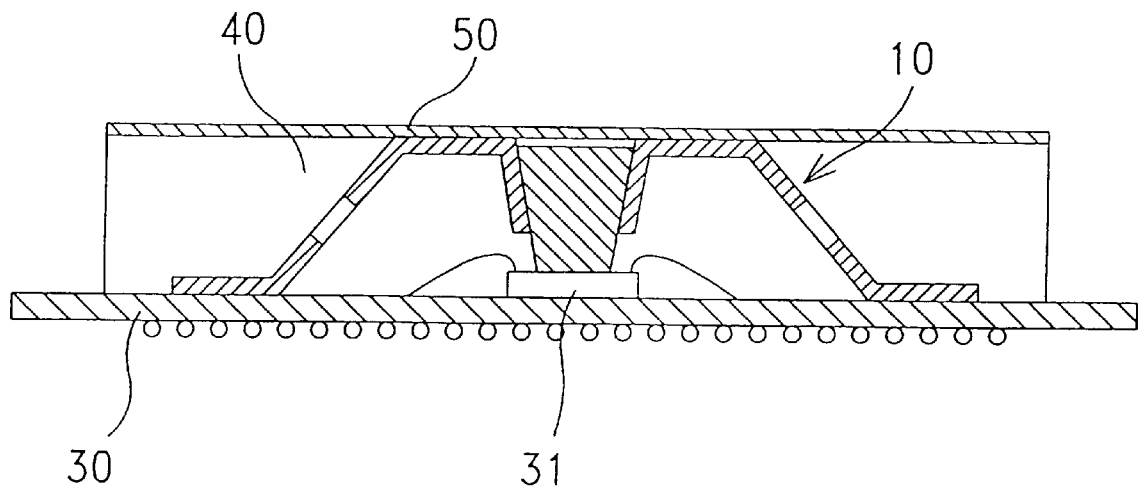
FIG. 9 is a sectional view showing a heat conductive cover plate covered on the top side of the packing material according to the present invention.
Figure 10:
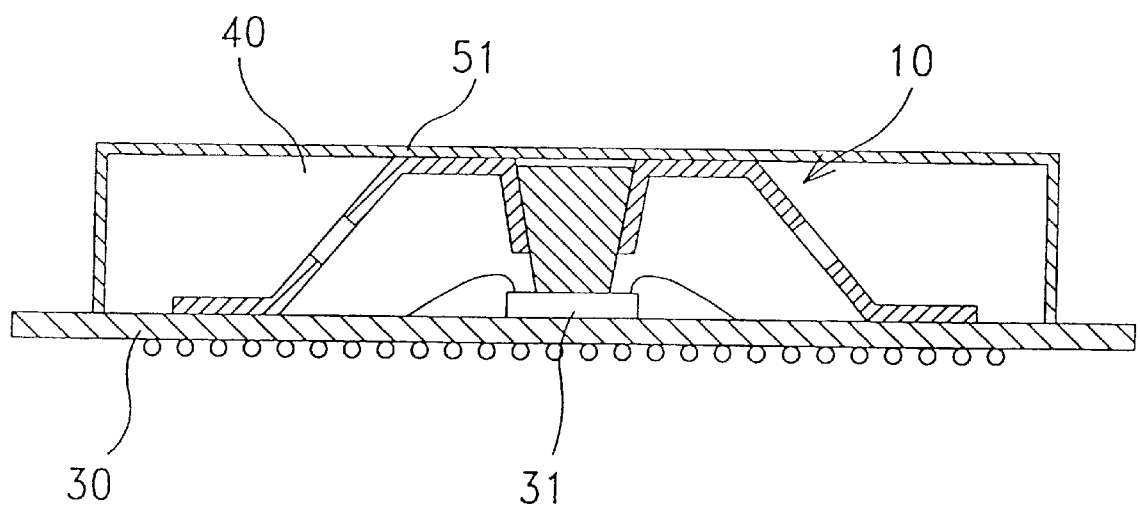
FIG. 10 is a sectional view showing a heat conductive cover plate cover on the top side and periphery of the packing material according to the present invention.

Referring to FIGS. 9 and 10, in an exposed type package, a heat conductive cover plate 50 or 51 is covered on the packing material 40 and disposed in close contact with the heat sink 10 for quick dissipation of heat.

It is to be understood that the drawings are designed for purposes of illustration only, and are not intended as a definition of the limits and scope of the invention disclosed.

What the invention claimed is:

1. An electronic device cooling arrangement comprising:
   a heat sink, said heat sink comprising a face panel section having a downwardly extended projecting portion defining a center through hole, supporting frame section downwardly outwardly extended from the periphery of said face panel section, and a mounting section integral with a bottom side of said supporting frame section remote from said face panel section and disposed at a lower elevation than said face panel section; and
   a heat conductive block mounted in the center through hole of said face panel section of said heat sink.

2. The electronic device cooling arrangement of claim 1 wherein the center through hole at said face panel section is a tapered hole having a diameter gradually reducing from the elevation of said face panel section toward the elevation of said mounting section.

3. The electronic device cooling arrangement of claim 2 wherein said heat conductive block is a tapered block fitting the tapered center through hole at said face panel section.

4. The electronic device cooling arrangement of claim 1 wherein said heat conductive block has a top side wall spaced from the topmost edge of said face panel section by a gap.

5. The electronic device cooling arrangement of claim 1 wherein said heat sink and said heat conductive block are respectively made of metal.

6. The electronic device cooling arrangement of claim 1 wherein said supporting frame section has a plurality of slots.

7. The electronic device cooling arrangement of claim 1 wherein said mounting section has a plurality of through holes.

8. The electronic device cooling arrangement of claim 1 wherein said heat conductive block has an outward locating flange at a bottom side thereof stopped outside the center through hole of said face panel section and suspended inside said heat sink.

9. The electronic device cooling arrangement of claim 1 wherein said face panel section of said heat sink has a chamfered top guide edge around said center through hole.

10. An electronic device cooling arrangement comprising:
    a substrate carrying a chip;
    a heat sink bonded to said substrate and covered on said chip, said heat sink comprising a face panel section suspended above said chip, said face panel section having a downwardly extended projecting portion defining a center through hole, a mounting section bonded to said substrate, and a supporting frame section connected between said face panel section and said mounting section;
    a heat conductive block mounted in the center through hole at said face panel section and disposed in contact with said chip; and
    an electrically insulative packing material molded on said heat sink.

11. The electronic device cooling arrangement of claim 10 wherein said electrically insulative packing material is epoxy resin.

12. The electronic device cooling arrangement of claim 10 wherein the center through hole at said face panel section is a tapered hole having a diameter gradually reducing from the elevation of said face panel section toward the elevation of said mounting section.

13. The electronic device cooling arrangement of claim 12 wherein said heat conductive block is a tapered block fitting the tapered center through hole at said face panel section.

14. The electronic device cooling arrangement of claim 10 wherein said heat conductive block has a top side wall spaced from the topmost edge of said face panel section by a gap.

15. The electronic device cooling arrangement of claim 10 wherein said heat sink and said heat conductive block are respectively made of metal.

16. The electronic device cooling arrangement of claim 10 wherein said supporting frame section has a plurality of slots.

17. The electronic device cooling arrangement of claim 10 wherein said mounting section has a plurality of through holes.

18. The electronic device cooling arrangement of claim 10 wherein said heat conductive block has an outward locating flange at a bottom side thereof stopped outside the center through hole of said face panel section and suspended inside said heat sink.

19. The electronic device cooling arrangement of claim 10 wherein said face panel section of said heat sink has a chamfered top guide edge around said center through hole.

20. The electronic device cooling arrangement of claim 10 further comprising a heat conductive cover plate covered on said electrically insulative packing material and disposed in contact with said heat sink.

* * * * *